United States Patent
Bobde (10) Patent No.: US 8,000,124 B2
(45) Date of Patent: *Aug. 16, 2011

(54) SYMMETRIC BLOCKING TRANSIENT VOLTAGE SUPPRESSOR (TVS) USING BIPOLAR TRANSISTOR BASE SNATCH

(75) Inventor: Madhur Bobde, San Jose, CA (US)

(73) Assignee: Alpha & Omega Semiconductor, Ltd (BM)

( * ) Notice: Subject to any disclaimer, the term of this patent is extended or adjusted under 35 U.S.C. 154(b) by 133 days.

This patent is subject to a terminal disclaimer.

(21) Appl. No.: 12/456,948

(22) Filed: Jun. 25, 2009

(65) Prior Publication Data

US 2009/0261883 A1    Oct. 22, 2009

Related U.S. Application Data

(62) Division of application No. 11/541,370, filed on Sep. 30, 2006, now Pat. No. 7,554,839.

(51) Int. Cl.
*G11C 5/06* (2006.01)
*G11C 11/34* (2006.01)
*G11C 7/10* (2006.01)

(52) U.S. Cl. ............ 365/72; 365/177; 365/189.06

(58) Field of Classification Search ............ 365/189.06, 365/177, 72
See application file for complete search history.

(56) References Cited

U.S. PATENT DOCUMENTS

| | | | | |
|---|---|---|---|---|
| 3,872,390 A * | 3/1975 | Nash | | 330/264 |
| 4,347,445 A * | 8/1982 | Baker | | 327/433 |
| 5,247,214 A * | 9/1993 | Okumura | | 326/110 |
| 5,495,118 A * | 2/1996 | Kinoshita et al. | | 257/355 |
| 5,665,994 A * | 9/1997 | Palara | | 257/378 |
| 5,808,345 A * | 9/1998 | Kinzer | | 257/378 |
| 6,882,576 B2 * | 4/2005 | Tomita | | 365/188 |
| 6,961,262 B2 * | 11/2005 | Perner | | 365/158 |
| 2006/0066408 A1 * | 3/2006 | Fang et al. | | 330/296 |
| 2007/0279824 A1 * | 12/2007 | Mallikararjunaswamy | | 361/118 |
| 2008/0048215 A1 * | 2/2008 | Davies | | 257/274 |

* cited by examiner

*Primary Examiner* — Ly D Pham
(74) *Attorney, Agent, or Firm* — Bo-In Lin (57) ABSTRACT

A symmetrical blocking transient voltage suppressing (TVS) circuit for suppressing a transient voltage includes an NPN transistor having a base electrically connected to a common source of two transistors whereby the base is tied to a terminal of a low potential in either a positive or a negative voltage transient. The two transistors are two substantially identical transistors for carrying out a substantially symmetrical bi-directional clamping a transient voltage. These two transistors further include a first and second MOSFET transistors having an electrically interconnected source. The first MOSFET transistor further includes a drain connected to a high potential terminal and a gate connected to the terminal of a low potential and the second MOSFET transistor further includes a drain connected to the terminal of a low potential terminal and a gate connected to the high potential terminal.

16 Claims, 6 Drawing Sheets

SYMMETRIC BLOCKING TRANSIENT VOLTAGE SUPPRESSOR (TVS) USING BIPOLAR TRANSISTOR BASE SNATCH

This patent application is a Divisional Application and claims the Priority Date of a application Ser. No. 11/541,370 filed on Sep. 30, 2006, now U.S. Pat. No. 7,554,839, by common Inventors of this application. The Disclosures made in the patent application Ser. No. 11/541,370 are hereby incorporated by reference.

BACKGROUND OF THE INVENTION

1. Field of the Invention

The invention relates generally to a circuit configuration and method of manufacturing a transient voltage suppressor (TVS). More particularly, this invention relates to an improved circuit configuration and method of manufacturing a symmetrical bi-directional blocking transient voltage suppressor (TVS) implemented with bipolar transistor base snatch to connect the base to a low potential terminal.

2. Description of the Relevant Art

The conventional technologies for designing and manufacturing a bi-directional blocking transient voltage suppressor (TVS) is still confronted with a technical difficulty that the base of a TVS device is connected to a terminal of floating potential. Typically, the bi-directional blocking TVS is implemented with symmetric NPN/PNP configuration with identical emitter-base and collector-base breakdown voltage. However, such implementation often leads to a floating base that further leads to difficulties of voltage variations over time, i.e., the dV/dt. The voltage variation over time further leads to the leakage current concerns due to the facts that when the base is floating, the voltage change dV/dt causes the equivalent capacitor generating charging and discharging currents that increase the leakage current.

The transient voltage suppressors (TVS) are commonly applied for protecting integrated circuits from damages due to the inadvertent occurrence of an over voltage imposed onto the integrated circuit. An integrated circuit is designed to operate over a normal range of voltages. However, in situations such as electrostatic discharge (ESD), electrical fast transients and lightning, an unexpected and an uncontrollable high voltage may accidentally strike onto the circuit. The TVS devices are required to serve the protection functions to circumvent the damages that are likely to occur to the integrated circuits when such over voltage conditions occur. As increasing number of devices are implemented with the integrated circuits that are vulnerable to over voltage damages, demands for TVS protection are also increased. Exemplary applications of TVS can be found in the USB power and data line protection, Digital video interface, high speed Ethernet, Notebook computers, monitors and flat panel displays.

Figure 1A:
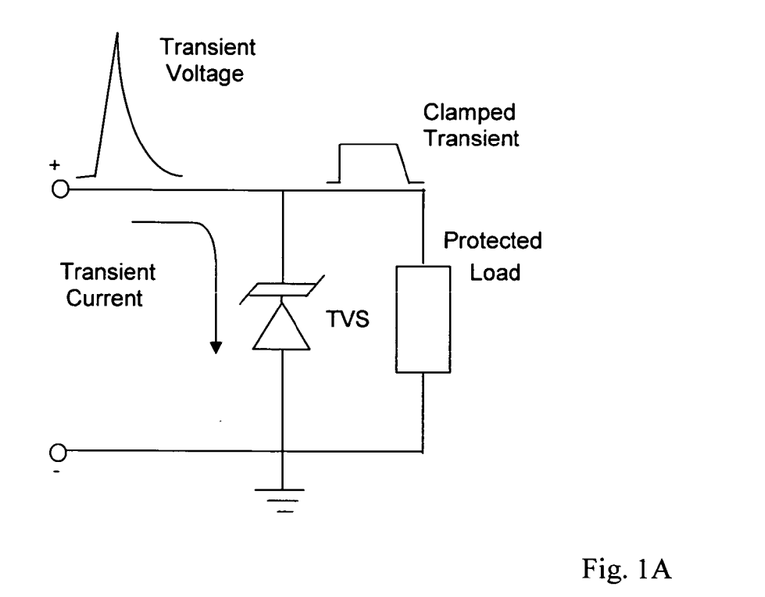
FIG. 1A is a circuit diagram for showing a conventional TVS device and FIG. 1B is an I-V diagram, i.e., a current versus voltage diagram, for illustrating the reverse characteristics of the TVS device.
Figure 1B:
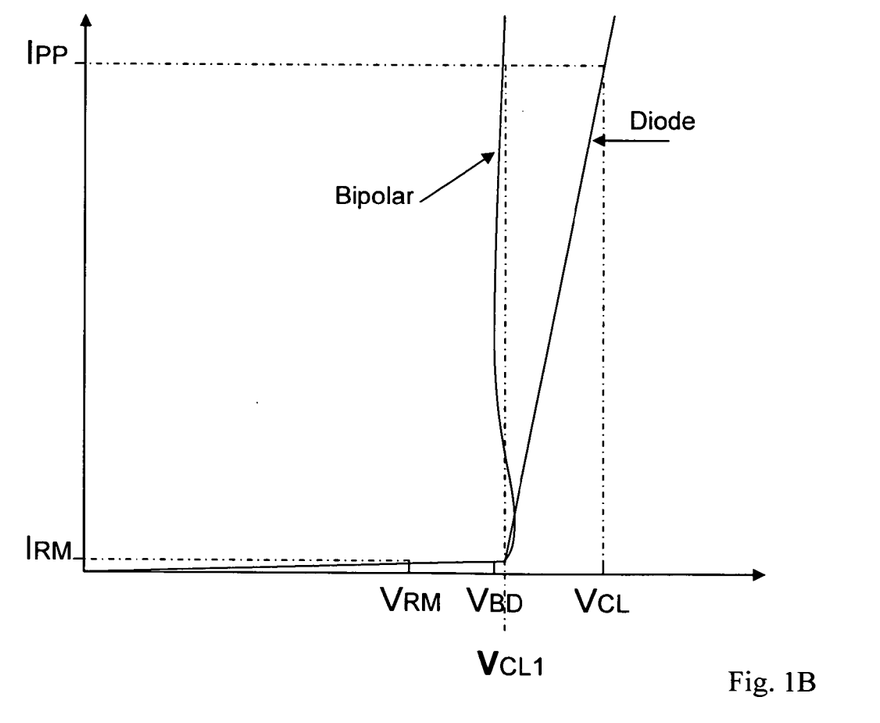

FIGS. 1A and 1B show a circuit diagram and a current-voltage diagram respectively of a TVS device. An idea TVS is to totally block the current, i.e., zero current, when the input voltage Vin is less than the breakdown voltage VBD for minimizing the leakage current. And, ideally, the TVS has close to zero resistance under the circumstance when the input voltage Vin is greater than the breakdown voltage VBD such that the transient voltage can be effectively clamped. A TVS can be implemented with the PN junction device that has a breakdown voltage to allow current conduction when a transient input voltage exceeds the breakdown voltage to achieve the transient voltage protection. However, the PN junction type of TVS has no minority carriers and has a poor clamping performance as that shown in FIG. 1B. There are alternate TVS implementations with Bipolar NPN/PNP with an Avalanche triggered turning-on of the Bipolar transistor. The base is flooded with minority carriers and the bipolar TVS can achieve better clamping voltage. However, the avalanche current is amplified with the bipolar gain.

Figure 2A:
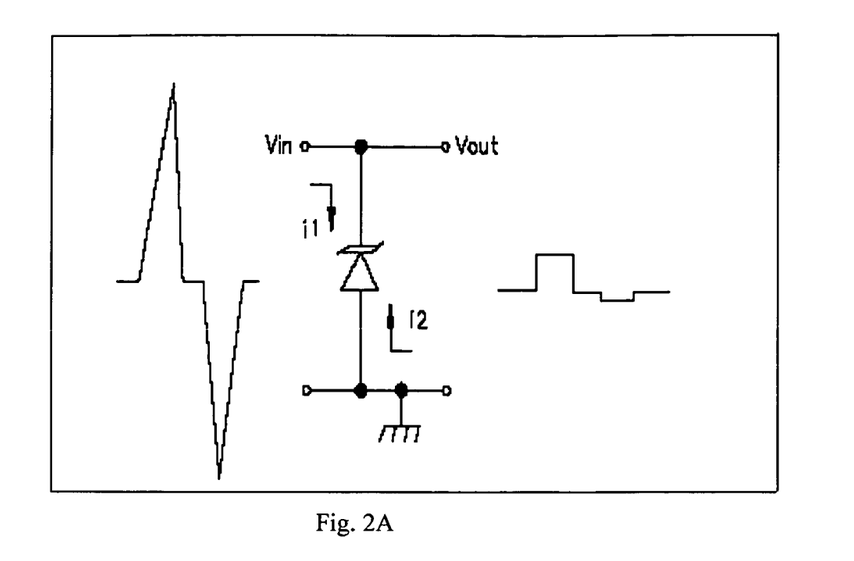
FIG. 2A shows a circuit diagram along with waveforms for illustrating the functions performed by the unidirectional device of asymmetric clamping of a unidirectional TVS.
Figure 2B:
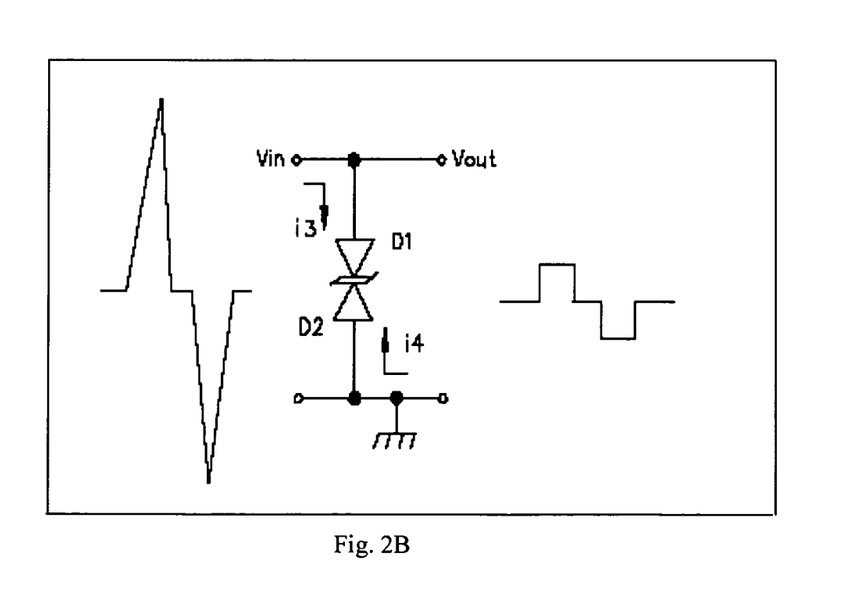
FIG. 2B shows a circuit diagram along with waveforms for illustrating the functions performed by the bi-directional device of symmetric clamping of a bi-directional TVS.

With the advancement of electronic technologies, there are increasingly more devices and applications that require bi-directional TVS protections. Devices for audio, ADSL, multiple-mode transceivers, and other electronic devices are required to provide the bi-directional TVS protections as these electronic devices are manufactured with components more vulnerable to transient voltages and operated under more different kinds of conditions that the transient voltage may occur either as positive or negative transient voltages. Currently, the most effective technique to provide the bi-directional TVS is to implement a symmetric NPN/PNP configuration with identical Emitter-Base and Collector-Base breakdown voltage. However, as discussed above, in a conventional bi-directional TVS device as that shown in FIGS. 2A and 2B, to have either symmetrical clamping or unsymmetrical clamping respectively, the base of the TVS in these NPN/PNP circuits are left at a floating potential in order to achieve symmetrical breakdown. The floating base in these implementations causes the dV/dt issues and also the leakage concerns.

Therefore, a need still exists in the fields of circuit design and device manufactures for providing a new and improved circuit configuration and manufacturing method to resolve the above-discussed difficulties. Specifically, a need still exists to provide new and improved TVS circuits that can provide bi-directional symmetrical blocking of transient current to achieve TVS protection by implementing NPN/PNP transistors where the base is always connected to the terminal with a potential such that the above discussed problems and difficulties are resolved.

SUMMARY OF THE PRESENT INVENTION

It is therefore an aspect of the present invention to provide a bi-directional symmetrical blocking TVS with a base that is connected to a lower potential such that the above-discussed difficulties and limitations encountered by the conventional bi-directional blocking TVS caused by a floating base can be overcome.

Another aspect of the present invention to provide a bi-directional symmetrical blocking TVS with a base connected to a lower potential and the TVS is implemented with either lateral or vertical configurations by applying the integrated circuit (IC) manufacturing processes.

Briefly in a preferred embodiment this invention discloses a symmetrical blocking transient voltage suppressing (TVS) circuit for suppressing a transient voltage. The symmetrical blocking transient voltage suppressing (TVS) circuit includes a bipolar transistor having a base electrically connected to a common source of two MOS transistors whereby the base of bipolar is tied to an emitter potential of the bipolar transistor in either a positive or a negative voltage transient. In another preferred embodiment, the two MOS transistors are two substantially identical transistors for carrying out a substantially symmetrical bi-directional clamping a transient voltage. These two MOS transistors further include a first and second MOSFET transistors having an electrically interconnected source. The first MOSFET transistor further includes a drain connected to a high potential terminal and a gate connected to the terminal of a low potential and the second MOSFET transistor further includes a drain connected to the terminal of a low potential terminal and a gate connected to the high potential terminal. In one embodiment, the symmetrical blocking transient voltage suppressing (TVS) circuit includes a NPN bipolar transistor having a base electrically connected to a common source of two MOS transistors, a collector connected to the high potential terminal and an emitter connected to the terminal of a low potential. In another embodiment, the symmetrical blocking transient voltage suppressing (TVS) circuit includes a PNP bipolar transistor having a base electrically connected to a common source of two MOS transistors, a collector connected to the low potential terminal and an emitter connected to the terminal of a high potential.

In another embodiment the first MOSFET transistor and the second MOSFET transistor further include two lateral MOSFET transistors extended laterally along a first direction of a semiconductor substrate and disposed laterally on two opposite sides of a doped region functioning as a base of the NPN transistor extending along a second direction over the semiconductor substrate perpendicular to the first direction. The first and second MOSFET transistors are encompassed in two N-well regions disposed laterally on two opposite sides of the doped region functioning as the base of the NPN bipolar transistor wherein the two N-well regions functioning as an emitter and a collector of the NPN transistor. The first MOSFET transistor and the second MOSFET transistor and the NPN bipolar transistor are manufactured by applying a CMOS manufacturing process.

In another preferred embodiment, the present invention further discloses an electronic device formed as an integrated circuit (IC) wherein the electronic device further includes a symmetrical blocking transient voltage suppressing (TVS) circuit. The first MOSFET transistor and the second MOSFET transistor of the TVS circuit further includes two lateral MOSFET transistors sharing a common source region encompassed in a P-body region functioning as the base of the NPN transistor. The NPN transistor further includes a vertical NPN transistor with the common source region functioning as a cathode terminal disposed above the P-body region functioning as the base region and a doped substrate layer disposed below the P-body region as an anode terminal of the NPN transistor. The first and second MOSFET transistors further include two lateral MOSFET transistors and the NPN transistor further includes a vertical NPN transistor manufactured by applying a DMOS manufacturing process.

The present invention further discloses a method for manufacturing an electronic device with an integrated symmetrical blocking transient voltage suppressing (TVS) circuit. The method includes a step of electrically connecting a base of an NPN transistor to a common source of two transistors to tie the base to a terminal of a low potential in either a positive or a negative voltage transient. The method further includes a step of manufacturing the two transistors as two substantially identical transistors for carrying out a substantially symmetrical bi-directional clamping a transient voltage. In a preferred embodiment, the method further includes a step of manufacturing the two transistors as a first and second MOSFET transistors having an electrically interconnected source for electrically connecting to the base of the NPN transistor. In a preferred embodiment, the method further includes a step of connecting a drain of the first MOSFET transistor to a high potential terminal and connecting a gate of the first transistor to the terminal of a low potential. The method further includes connecting a drain of the second MOSFET transistor to the terminal of a low potential terminal and connecting a gate of the second MOSFET transistor to the high potential terminal. In another preferred embodiment, the method further includes a step of extending laterally the first MOSFET transistor and the second MOSFET transistor along a first direction of a semiconductor substrate on two opposite sides of a doped region; and extending the doped region along a second direction over the semiconductor substrate perpendicular to the first direction for functioning as a base of the NPN transistor. In another embodiment, the method further includes a step of encompassing the first and second MOSFET transistors in two N-well regions disposed laterally on two opposite sides of the doped region as the base of the NPN transistor; whereby the two N-wells functioning as an anode and a cathode for the NPN transistor. In an exemplary embodiment, the method further includes a step of applying a CMOS manufacturing process to manufacture the first and second MOSFET transistors and the NPN transistor.

These and other objects and advantages of the present invention will no doubt become obvious to those of ordinary skill in the art after having read the following detailed description of the preferred embodiment, which is illustrated in the various drawing figures.

DETAILED DESCRIPTION OF THE METHOD

Figure 3A:
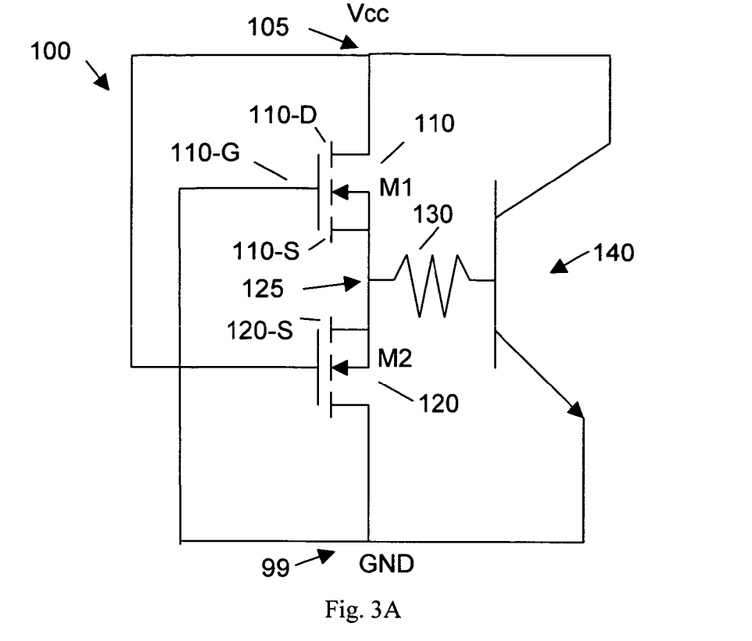
FIGS. 3A and 3B are circuit diagrams of bi-directional symmetrical clamping TVS of this invention with the base always connected to the bipolar emitter potential.

Referring to FIG. 3A for a circuit diagram of new and improved TVS that has a bi-directional symmetric blocking function. The TVS 100 includes two MOSFET transistors. The first transistor 110 shown as M1 has a source terminal 110-S connected to a source terminal 120-S of a second transistor 120 shown as M2. The first transistor 110 further has a drain terminal 110-D connected to a high voltage terminal 105 with a voltage Vcc and a gate terminal 110-G connected to a ground terminal 99 with a voltage GND. The second transistor 120 further has a drain terminal connected to the ground terminal GND and a gate terminal connected to the high voltage terminal Vcc. The interconnected point 125 of the source terminals of the first transistor 110 and second transistor 120 is further connected via a resistor 130 to a base of a NPN transistor 140 connected in parallel between the main voltage terminal Vcc and the ground terminal GND, with emitter connected to GND and collector connected to Vcc.

During a positive ESD event when Vcc>GND, the second transistor 120 is turned on while the first transistor 110 is turned off and the base of NPN transistor 140 is grounded through the resistor 130. During a negative ESD event when Vcc<GND, the second transistor 120 is turned off while the first transistor 110 is turned on and the NPN transistor 140 is connected to the main voltage terminal Vcc through the resistor 130. In either case the NPN base is connected to the terminal with lower potential. The PN junction breaks down when the transient voltage exceed the designated breakdown voltage thus clamp the voltage at the designated level. A symmetrical bi-directional block is achieved. Unlike the floating base as that implemented in a conventional TVS, the base is connected to a terminal lower potential through the resistor 130 and greatly reduce the charging and discharging current.

Figure 3B:
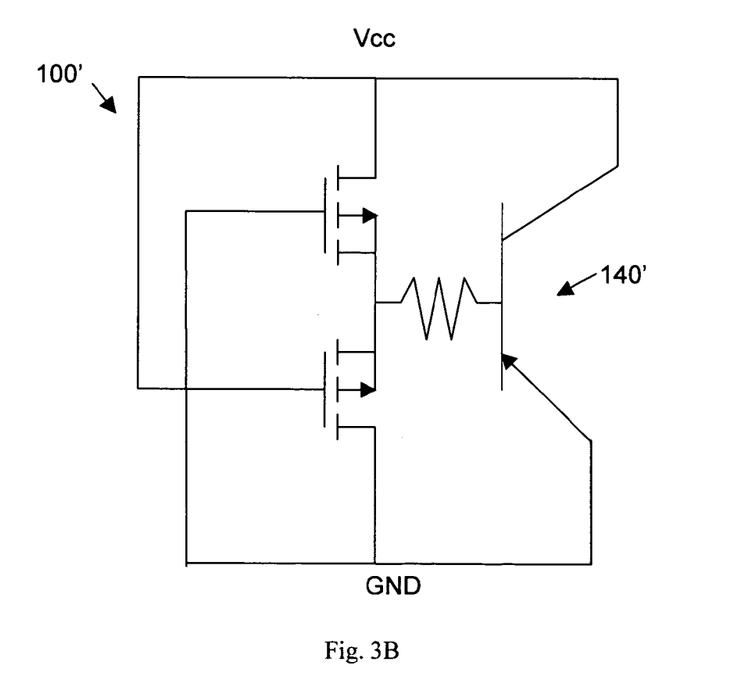

FIG. 3B is a circuit diagrams of bi-directional symmetrical clamping TVS of this invention implemented with PNP bipolar transistor. The TVS 100' is similar to TVS 100 of FIG. 3A except that the PNP has an emitter connected to Vcc and a collector connected to GND. The operation principle is the same as FIG. 3A.

Figure 4:
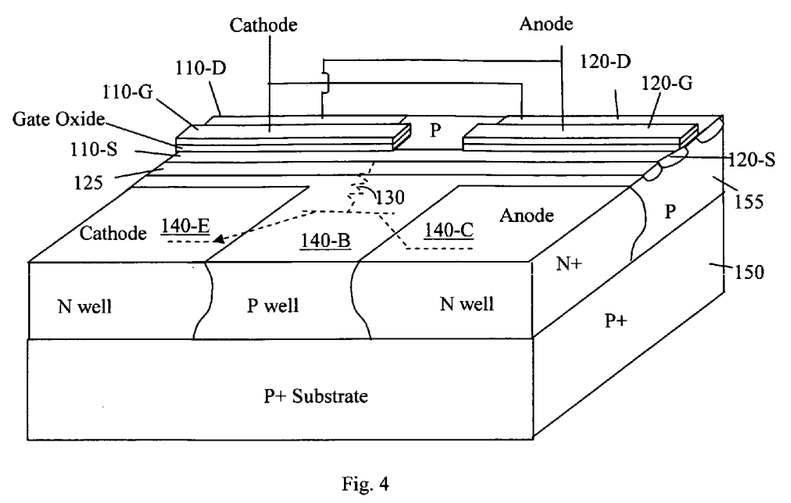
FIG. 4 is a perspective view for showing a lateral implementation of the TVS of FIG. 3A.

The bi-directional symmetrical-blocking TVS as shown in FIG. 3A is implemented as a lateral device shown in FIG. 4 in a P Epi layer 155 formed on top of a P+ substrate 150. There are two N-wells 140-C and 140-E formed laterally around a P-well 140-B provided by Epi layer 155 to function as a lateral NPN transistor 140. Part of P-well extended from a body contact P+ region next to the source region, i.e., terminal 125 to provide the distributive resistor Rs 130. The resistor 130 is connected to the source terminals 110-S and 120-S of the first and second MOSFET transistors 110 and 120 disposed laterally on two opposite sides of the P-well 130. The collector 140-C of the NPN transistor 140, the gate 110-G and the drain 120-D are connected to the cathode or GND terminal while the emitter 140-E of the NPN transistor 140, the gate 120-G and the drain 110-D are connected to the anode or Vcc through a two-metal-layer contact scheme (not shown). A symmetrical Bi-directional blocking TVS can be conveniently manufactured by applying standard CMOS manufacturing processes.

Figure 5:
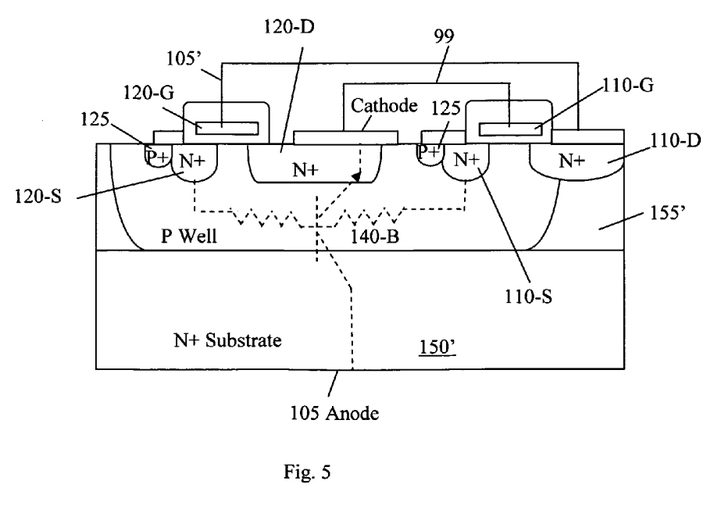
FIG. 5 is a cross sectional view for showing a vertical implementation of the TVS of FIG. 3A.

FIG. 5 shows another implementation where the NPN transistor 140 is formed vertically with a N+ region 120-D disposed on top of a P-well 140-B over a bottom N+ substrate 150'r that connected to the ground terminal 99. P-well 140-B also functions as the body of the MOS transistors. A P+ region 125 is placed next to a source regions 110-S and 120-S for the two MOSFET devices 110 and 120 for source/body short contact. Therefore, the method of manufacturing process of the symmetrical TVS circuit includes a step of configuring the first and second MOSFET transistors as two lateral MOSFET transistors sharing a common source region and encompassed the first and second MOSFET transistors in a P-body region to function as the base of the NPN transistor. The method further includes a step of supporting the P-body region with a bottom N-doped region for combing with the P-body region functioning as a base interposed between the common source region functioning as an anode and the bottom doped region functioning as a cathode for the NPN transistor formed as a vertical NPN transistor in the semiconductor substrate. Specifically, the process may start with forming a N Epi layer 155' on top of a N+ substrate 150' followed by implanting a P-well 140-B in the Epi layer. The source regions 110-S and 120-S and drain regions 110-D and 120-D are then implanted using a mark. Gate 110-G and 120-G may be formed before or after the source/drain implant by blanket deposition of a poly layer over a thermally formed gate oxide then etch off with a mask. A dielectric layer may be formed on the top surface followed by contact opening and P+ body contact 125 implant. In a preferred embodiment, the process includes a step of applying a double metal layer manufacturing process to electrically connect anode and cathode to corresponding semiconductor regions. The anode 105' on the top surface of semiconductor and the anode 105 on the bottom surface of semiconductor may be electrically connected on a leadframe (not shown) of a package or on the chip, such as forming a P+ sinker (not shown) from top down to P+ substrate.

Figure 6A:
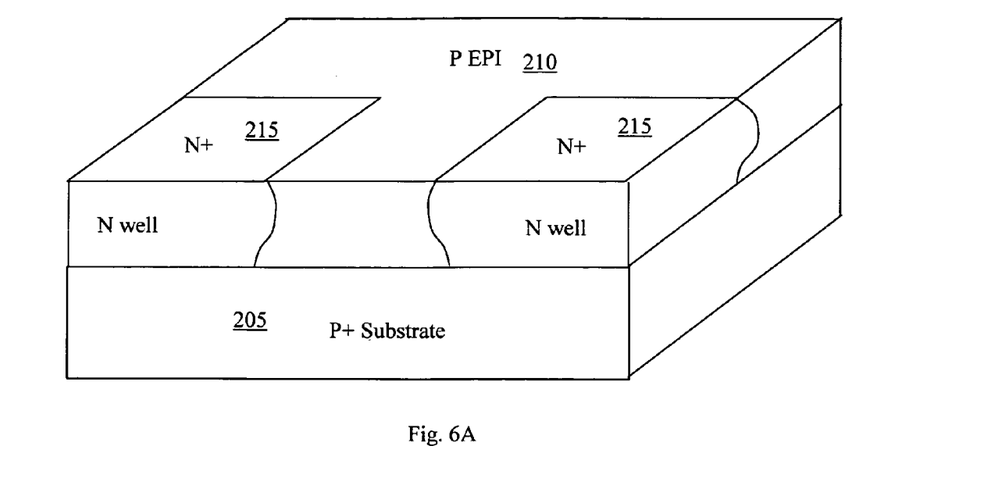
FIGS. 6A to 6C are perspective views for showing standard CMOS processes for manufacturing a symmetrical TVS device of FIG. 4.
Figure 6B:
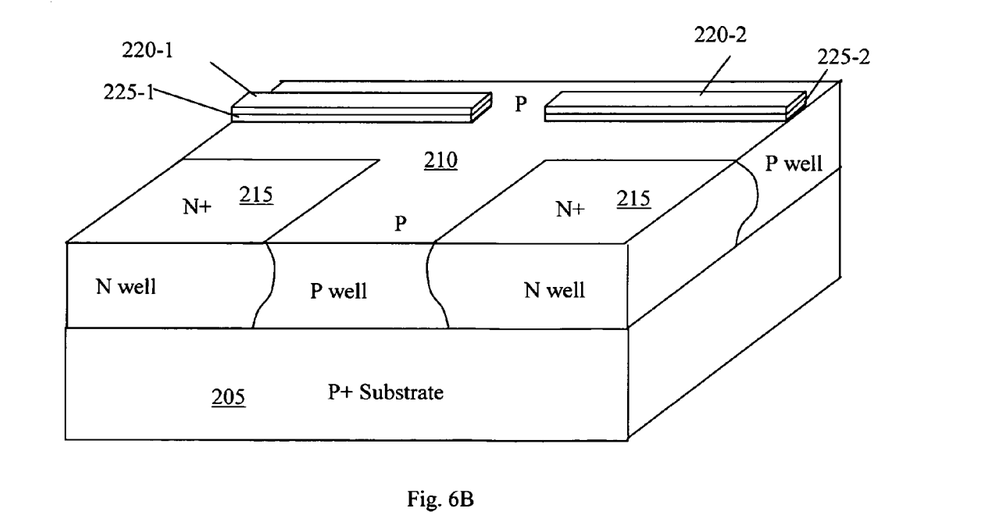
Figure 6C:
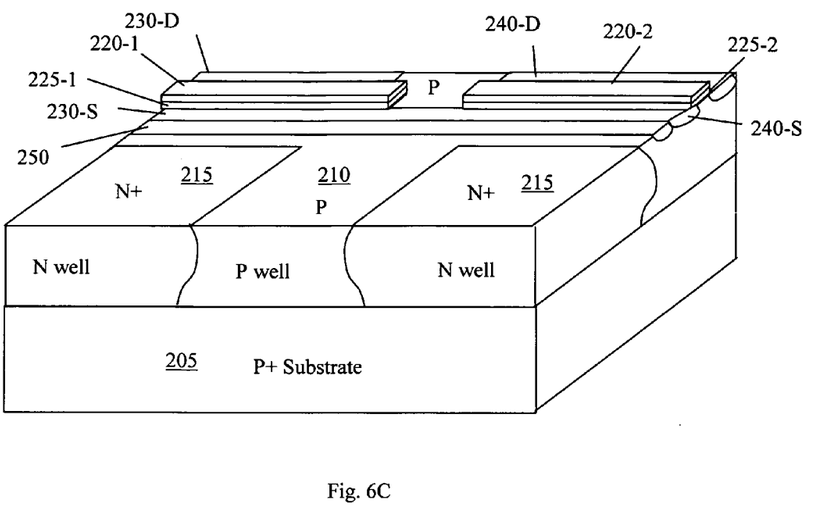

Referring to FIGS. 6A to 6C for a series of perspective view to show standard CMOS processing steps to manufacture a TVS device as that shown in FIG. 4. In FIG. 6A, a P+ substrate 205 supporting a P-doped epitaxial layer 210 is implanted to form two N-well 215. In FIG. 6B, a gate oxide layer 225 is first formed followed by deposition of a polysilicon gate layer and patterned into two gate segments 220-1 and 220-2 designated as M1 gate and M2 gate. The gate segments are each padded by the gate oxide layer 225-1 and 225-2 respectively. Then, in FIG. 6C, a mask (not shown) is applied to carry out a source and drain implant to form the source and drain regions 230-S and 230-D for transistor M1 and 240-S and 240-D for transistor M2. With the interconnecting source regions 230-S and 240-S for as a N+ source region. The manufacturing processes continue with the formation of an oxide/BPSG layer and opening a P body contact opening. A body contact implant is performed to dope a P+ body contact 250. Then deposition and patterning of two metal layers (not shown) are performed to complete the device manufacturing processes of a TVS device shown in FIG. 4.

Although the present invention has been described in terms of the presently preferred embodiment, it is to be understood that such disclosure is not to be interpreted as limiting. Various alterations and modifications will no doubt become apparent to those skilled in the art after reading the above disclosure. Accordingly, it is intended that the appended claims be interpreted as covering all alterations and modifications as fall within the true spirit and scope of the invention.

I claim:

1. A semiconductor device comprising:
   a first transistor and a second transistor; and
   a bipolar transistor, wherein said bipolar transistor having a base directly connected to a common source of said first and second transistors whereby said base is tied to a potential of said bipolar transistor emitter in either a positive or a negative voltage transients functioning as a symmetrical block transient voltage suppressor (TVS), and
   wherein said first and second transistor further comprising a first and a second N-channel MOSFET transistors having a directly interconnected source.

2. A semiconductor device comprising:
   a first transistor and a second transistor; and
   a bipolar transistor, wherein said bipolar transistor having a base directly connected to a common source of said first and second transistors whereby said base is tied to a potential of said bipolar transistor emitter in either a positive or a negative voltage transients functioning as a symmetrical blocking transient voltage suppressor (TVS),
   wherein said first and second transistors further comprising a first and a second MOSFET transistors having a directly interconnected source, and
   wherein said bipolar transistor comprising an NPN transistor with an emitter connected to said terminal of low potential and a collector to said terminal of high voltage potential wherein said bipolar NPN transistor comprising a lateral transistor.

3. The semiconductor device of claim 2 wherein:
   said first MOSFET transistor and said second MOSFET transistor further comprising two lateral MOSFET transistors extended laterally along a first direction of a semiconductor substrate and disposed laterally on two opposite sides of a doped region functioning as a base of said NPN transistor extending along a second direction over said semiconductor substrate perpendicular to said first direction.

4. The semiconductor device of claim 3 wherein:

two N-well regions disposed laterally on two opposite sides of said doped region functioning as said base of said NPN transistor wherein said two N-well regions functioning as an emitter and a collector of said NPN transistor.

5. The semiconductor device of claim 4 wherein:

said first MOSFET transistor and said second MOSFET transistor further comprising two lateral MOSFET transistors sharing a common source region encompassed in a P-body region extending to said base of said NPN transistor.

6. A semiconductor device comprising:

a first transistor and a second transistor; and a bipolar transistor, wherein said bipolar transistor having a base directly connected to a common source of said first and second transistors whereby said based is tied to a potential of said bipolar transistor emitter in either a positive or a negative voltage transients functioning as a symmetrical blocking transient voltage suppressor (TVS), wherein said first and second transistors further comprising a first and a second MOSFET transistors having a directly interconnected source, and wherein said bipolar transistor comprises an NPN transistor with an emitter connected to said terminal of low potential and a collector connected to said terminal of high voltage potential wherein said bipolar NPN transistor comprises a vertical transistor.

7. The semiconductor device of claim 6 wherein:

said first and second MOSFET transistors further comprising two lateral MOSFET transistors.

8. The semiconductor device of claim 6 wherein:

a P-well formed in an N Epi layer on top of an N+ substrate providing a body region for said first and second MOSFET transistors extending to said base region of said NPN transistor.

9. The semiconductor device of claim 8 wherein:

an N+ region implanted in said P-well providing a drain region said second MOSFET functioning as an emitter of said NPN transistor.

10. A method of manufacturing a symmetrical blocking transient voltage suppressing (TVS) circuit comprising:

directly connecting base of a bipolar transistor to a common source of two transistors to tie said base to a terminal of an emitter potential of said bipolar transistor in either a positive or a negative voltage transients;

manufacturing said two transistors as a first and a second MOSFET transistors having a directly interconnected source for directly connecting to said base of said bipolar transistor;

connecting a drain of said first MOSFET transistor to a high potential terminal and connecting a gate of said first transistor to said terminal of a low potential; and connecting a drain of said second MOSFET transistor to said terminal of a low potential terminal and connecting a gate of said second MOSFET transistor to said high potential terminal.

11. The method of claim 10 further comprising:

manufacturing said two MOSFET transistors as two substantially identical MOSFET transistors for carrying out a substantially symmetrical bi-directional clamping a transient voltage.

12. The method of claim 10 wherein:

the step of manufacturing said two transistors further includes a step of extending laterally said first MOSFET transistor and said second MOSFET transistor along a first direction of a semiconductor substrate on two opposite sides of a doped region; and extending said doped region along a second direction over said semiconductor substrate perpendicular to said first direction to a base of said bipolar transistor.

13. The method of claim 10 wherein:

the step of electrically connecting a base of a bipolar transistor to a common source of two transistors comprising a step of connecting a base of a NPN bipolar transistor to a common source of two transistors.

14. The method of claim 13 further comprising:

forming two N-well regions laterally on two opposite sides of said doped region as said base of said bipolar transistor; whereby said two N-wells functioning as an emitter and a collector for said bipolar transistor.

15. The method of claim 14 wherein:

the step of manufacturing said two transistors further includes a step of manufacturing said first and second MOSFET transistors as two lateral MOSFET transistors sharing a common source region and encompassed said first and second MOSFET transistors in a P-body region extending to said base of said NPN bipolar transistor.

16. The method of claim 14 further comprising:

forming a P-well region in a N epi layer on top of a bottom N+ substrate for extending P-body regions of said first and second MOSFET to a base of said NPN interposed between said N+ substrate functioning as a collector and a drain region of said second MOSFET functioning as an emitter for said NPN transistor formed as a vertical NPN transistor in said semiconductor substrate.

\* \* \* \* \*